United States Patent
Yokokawa et al.

(10) Patent No.: US 8,751,908 B2
(45) Date of Patent: Jun. 10, 2014

(54) DECODING DEVICE AND METHOD, AND PROGRAM

(75) Inventors: Takashi Yokokawa, Kanagawa (JP); Yutaka Nakada, Tokyo (JP); Ryoji Ikegaya, Kanagawa (JP)

(73) Assignee: Sony Corporation, Tokyo (JP)

( * ) Notice: Subject to any disclaimer, the term of this patent is extended or adjusted under 35 U.S.C. 154(b) by 289 days.

(21) Appl. No.: 13/235,794

(22) Filed: Sep. 19, 2011

(65) Prior Publication Data

US 2012/0110407 A1 May 3, 2012

(30) Foreign Application Priority Data

Oct. 27, 2010 (JP) ................. 2010-240242

(51) Int. Cl.
*H03M 13/00* (2006.01)
(52) U.S. Cl.
USPC ........... 714/776; 714/755; 714/788; 714/786; 714/762
(58) Field of Classification Search
USPC .................. 714/776, 755, 788, 762, 786
See application file for complete search history.

(56) References Cited

U.S. PATENT DOCUMENTS

| 7,516,066 B2 * | 4/2009 | Schuijers et al. ............. 704/219 |
| 2005/0154957 A1 * | 7/2005 | Jacobsen ........................ 714/752 |
| 2011/0305300 A1 * | 12/2011 | Ko ................................. 375/298 |

OTHER PUBLICATIONS

Extended Search Report issued Feb. 9, 2012 in European Patent Application No. 11180403.5-1247.
U.S. Appl. No. 13/238,397, filed Sep. 21, 2011, Yokokawa, et al.

* cited by examiner

*Primary Examiner* — Guy Lamarre
(74) *Attorney, Agent, or Firm* — Oblon, Spivak, McClelland, Maier & Neustadt, L.L.P.

(57) ABSTRACT

Disclosed herein is a decoding device including: an extracting section, a storing section, an allocating section, and a decoding section. The extracting section acquires data containing plural code words and information other than the plural code words in one frame, and extracts the plural code words from the data every one code word. The storing section at least stores the one code word extracted by the extracting section. The allocating section sets time obtained by dividing time for the one frame by the number of code words contained in the one frame as time allocated to decoding of one code word. The decoding section decodes the code word within the time allocated by the allocating section.

8 Claims, 10 Drawing Sheets

DECODING DEVICE AND METHOD, AND PROGRAM

BACKGROUND

The present disclosure relates to a decoding device and a decoding method, and a program, and more particularly relates to a decoding device and a decoding method by which decoding can be carried out more precisely, and a program for use therein.

In recent years, for example, a research in a communication field such as mobile communication, and a broadcasting field such as a terrestrial broadcasting or a satellite digital broadcasting has been remarkably advanced. Along with the advance of this research, with the view to increased efficiency of error-correction encoding and decoding, a research about the coding theory is actively being carried out.

A Shannon limitation given by a communication path encoding theorem made by C. E. Shannon is known as a theoretical limitation of encoding performance. A research about the encoding theory is carried out for the purpose of developing the code showing the performance close to the Shannon limitation. In recent years, Low Density Parity Check codes (hereinafter referred to as "LDPC codes") as an encoding method known from the past are being in the limelight.

The LDPC coding was firstly proposed in a Non-patent Document 1 of R. G. Gallagar: "Low-Density Parity-Check Codes," IRE Transactions on Information Theory, 1962. After that time, the LDPC encoding has arrived at re-attention in "D. J. C. Mackay: "Good error correcting codes based on very sparse matrices," IEEE Trans. Inf. Theory, IT-45, pp. 399 to 431, 1999, "M. G. Luby, M. Mitzenmacher, M. A. Shokrollahi and D. A. Spielman: "Analysis of low density codes and improved designs using irregular graphs," in Proceeings of ACM Symposium on Theory of Computing, pp. 249 to 258, 1998," and the like.

With regard to the LDPC encoding, from the recent research, it is being found out that the performance close to the Shannon limitation is obtained as the code length is lengthened. Also, as described above, the LDPC coding is adopted in the terrestrial digital broadcasting standard. For example, the LDPC coding is adopted in DVB-T2 (Digital Video Broadcasting-Terrestrial 2), DVB-C2 (Digital Video Broadcasting-Cable 2), DTMB (Digital Terrestrial Multimedia Broadcast), and the like.

SUMMARY

The LDPC code is a repetitive code, and is decoded by using repetitive decoding called Brief Propagation Algorithm. The performance (precision) of the LDPC code depends on the number of times of the repetition. Thus, the precision becomes high as the number of times of the repetition becomes more. Thus, it is preferable that the number of times of the repetition is increased and the decoding is precisely carried out. However, due to a restriction to time spent on the decoding processing, it may be impossible to necessarily obtain the sufficient number of times of the repetition in some cases.

For example, let us consider the case where plural code words, that is, three code words: a code word A; a code word B; and a code word C are decoded within predetermined periods of time, respectively. When the code word A, the code word B, and the code word C are decoded within periods of time, respectively, into which a predetermined period of time is equally divided, the code word A, the code word B, and the code word C can be decoded with the numbers of times of the repetition as the same number of times of the repetition. However, normally, even if the predetermined period of time for the processing is equally divided, it is expected that it may be impossible to carry out the repetitive decoding with the same number of times of the repetition due to an influence or the like of presence of a guard interval or the like.

When the numbers of times of the repetition for the code word A, the code word B, and the code word C are different from one another because it may be impossible to carry out the three pieces of repetitive decoding with the same number of times of the repetition, the performance of the code word corresponding to the less number of times of the repetition becomes dominant. As a result, the decoding performance is made to become worse.

The present disclosure has been made in order to solve the problems described above, and it is therefore desirable to provide a decoding device and a decoding method by which when repetitive decoding is carried out, the number of times of repetition thereof is controlled, thereby making it possible to remove a dispersion in precision of decoding for each code word, and a program for use therein.

In order to attain the desire described above, according to an embodiment of the present disclosure, there is provided a decoding device including: an extracting section acquiring data containing therein plural code words and information other than the plural code words in one frame, and extracting the plural code words from the data every one code word; a storing section at least storing therein the one code word extracted by the extracting section; an allocating section setting time obtained by dividing time for the one frame by the number of code words contained in the one frame as time allocated to decoding of one code word; and a decoding section decoding the code word within the time allocated by the allocating section.

According to another embodiment of the present disclosure, there is provided a decoding method for use in a decoding device including an extracting section, a storing section, an allocating section, and a decoding section, said decoding method including: acquiring data containing therein plural code words and information other than the plural code words in one frame, and extracting the plural code words from the data every one code word by the extracting section; at least storing therein the one code word extracted by the extracting section by the storing section; setting time obtained by dividing time for the one frame by the number of code words contained in the one frame as time allocated to decoding of one code word by said allocating section; and decoding the code word within the time allocated by the allocating section by the decoding section.

According to still another embodiment of the present disclosure, there is provided a program readable by a computer which controls a decoding device including an extracting section, a storing section, an allocating section, and a decoding section. The program instructs the computer to execute processing including acquiring data containing plural code words and information other than the plural code words in one frame, and extracting the plural code words from the data every one code word by the extracting section, at least storing the one code word extracted by the extracting section by the storing section, setting time obtained by dividing time for the one frame by the number of code words contained in the one frame as time allocated to decoding of one code word by the allocating section; and decoding the code word within the time allocated by the allocating section by the decoding section.

According to the above embodiments of the present disclosure, the data containing therein the plural code words, and the information other than the plural code words in one frame is acquired. The plural code words are extracted from the data every one code word, and one code word thus extracted is at least stored. The time obtained by dividing the time for one frame by the number of code words contained in one frame is set as the time allocated to the decoding for one code word, thereby carrying out the decoding.

As set forth hereinabove, according to the present disclosure, when the repetitive decoding is carried out, the number of times of the repetition thereof is controlled, which results in that it is possible to remove the dispersion in the precision of the decoding for each code word.

DETAILED DESCRIPTION OF THE PREFERRED EMBODIMENTS

Embodiments of the present disclosure will be described in detail hereinafter with reference to the accompanying drawings. A decoding device which will be described below can be applied to a receiver for receiving a digital terrestrial wave broadcasting. Therefore, firstly, the receiver including a first embodiment of the decoding device will be described below.

Configuration of Receiver Including First Embodiment of Decoding Device

Figure 1:
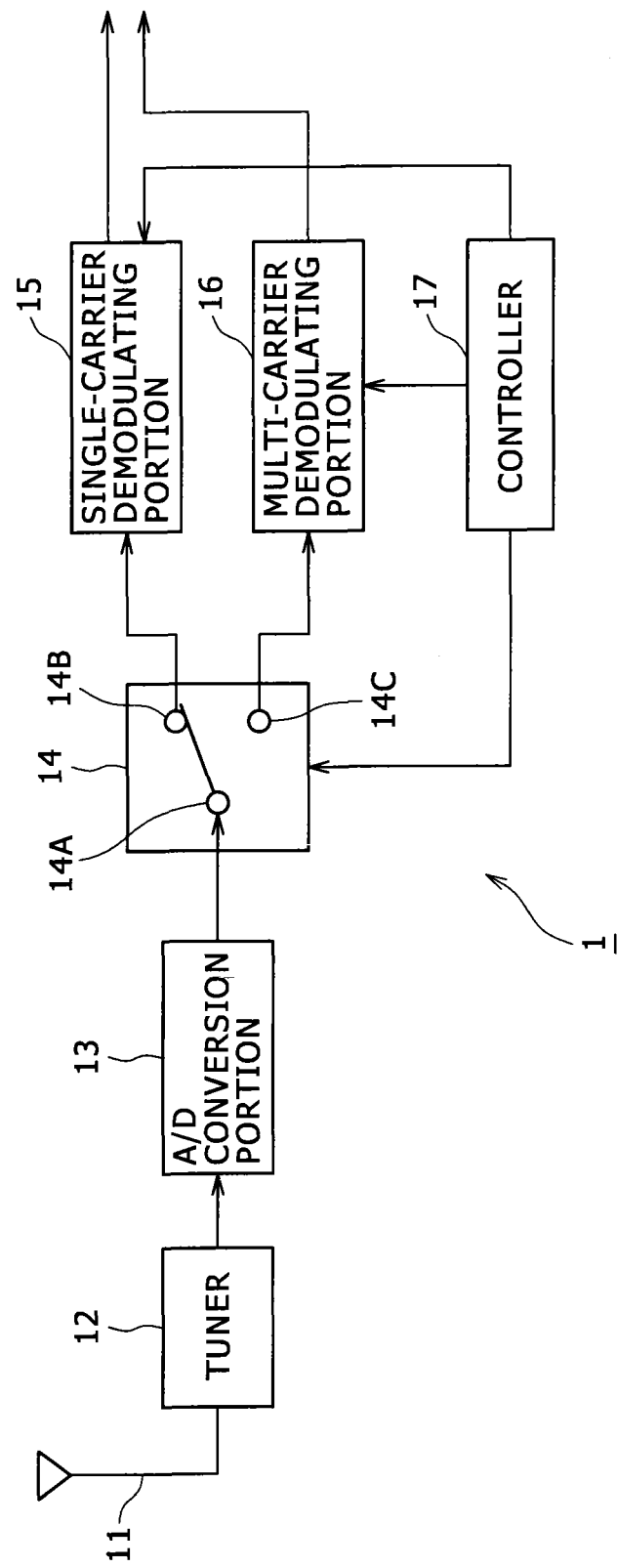
FIG. 1 is a block diagram, partly in circuit, explaining a configuration of a receiver for receiving a digital broadcasting wave.

FIG. 1 is a block diagram, partly in circuit, explaining a configuration of a receiver for receiving a digital broadcasting wave.

The receiver 1 is composed of an antenna 11, a tuner 12, an A/D (analog to digital) conversion portion 13, a switchover portion 14, a single-carrier demodulating portion 15, a multi-carrier demodulating portion 16, and a controller 17. The receiver 1, for example, is one complying with the Digital Terrestrial Multimedia Broadcast (DTMB) standard as the standard of the terrestrial digital broadcasting.

In the DTMB standard, any of a modulation system using a single-carrier and a modulation system using a multi-carrier can be selected as a system for modulating the data. A function of demodulating the data transmitted by the modulation system using single-carrier, and function of demodulating the data transmitted by the modulation system using multi-carrier are prepared for the receiver complying with the DTMB standard.

Hereinafter, the transmitting of the data by using the modulation system using the single-carrier will be referred to as "the single-carrier transmission," and the transmitting of the data by using the modulation system using the multi-carrier will be referred to as "the multi-carrier transmission."

The tuner 12 receives an RF signal and outputs an IF signal obtained through the frequency conversion of the RF signal to the A/D conversion portion 13.

The A/D conversion portion 13 subjects the IF signal supplied thereto from the tuner 12 to A/D conversion, and outputs the resulting data (digital signal) to the switchover portion 14.

The switchover portion 14 switches an output destination of the data (digital signal) supplied thereto from the A/D conversion portion 13 in accordance with the control made by the controller 17. When the data which has been transmitted to the switchover portion 14 through the single-carrier transmission is demodulated, the switchover portion 14 connects to a switch 14A to a terminal 14B, and outputs the data supplied thereto from the A/D conversion portion 13 to the single-carrier demodulating portion 15. On the other hand, when the data which has been transmitted to the switchover portion 14 through the multi-carrier transmission is demodulated, the switchover portion 14 connects to the switch 14A to a terminal 14C, and outputs the data supplied thereto from the A/D conversion portion 13 to the multi-carrier demodulating portion 15.

The single-carrier demodulating portion 15 demodulates the data supplied thereto from the switchover portion 14 in accordance with the control made by the controller 17, and outputs the resulting data.

The multi-carrier demodulating portion 16 demodulates the data supplied thereto from the switchover portion 14 in accordance with the control made by the controller 17, and outputs the resulting data. When the OFDM system is used in the multi-carrier transmission, an OFDM signal having a base band which has been obtained through orthogonal demodulation carried out in a processing portion (not shown) so as to be aimed at the output signal from the A/D conversion portion 13 is inputted to the multi-carrier demodulating portion 16.

The data which has been demodulated either in the single-carrier demodulating portion 15 or in the multi-carrier demodulating portion 16, for example, is supplied to the processing portion in a subsequent stage. Thus, the processing portion subjects the data supplied thereto to processing such as error correction.

The controller 17 executes a predetermined program, thereby controlling the entire operation of the receiver 1. For example, the controller 17 controls the switchover portion 14 depending on whether the modulation system used in a channel in reception is used in the single-carrier transmission or in the multi-carrier transmission, thereby switching the output destination of the data over to the other.

Figure 2:
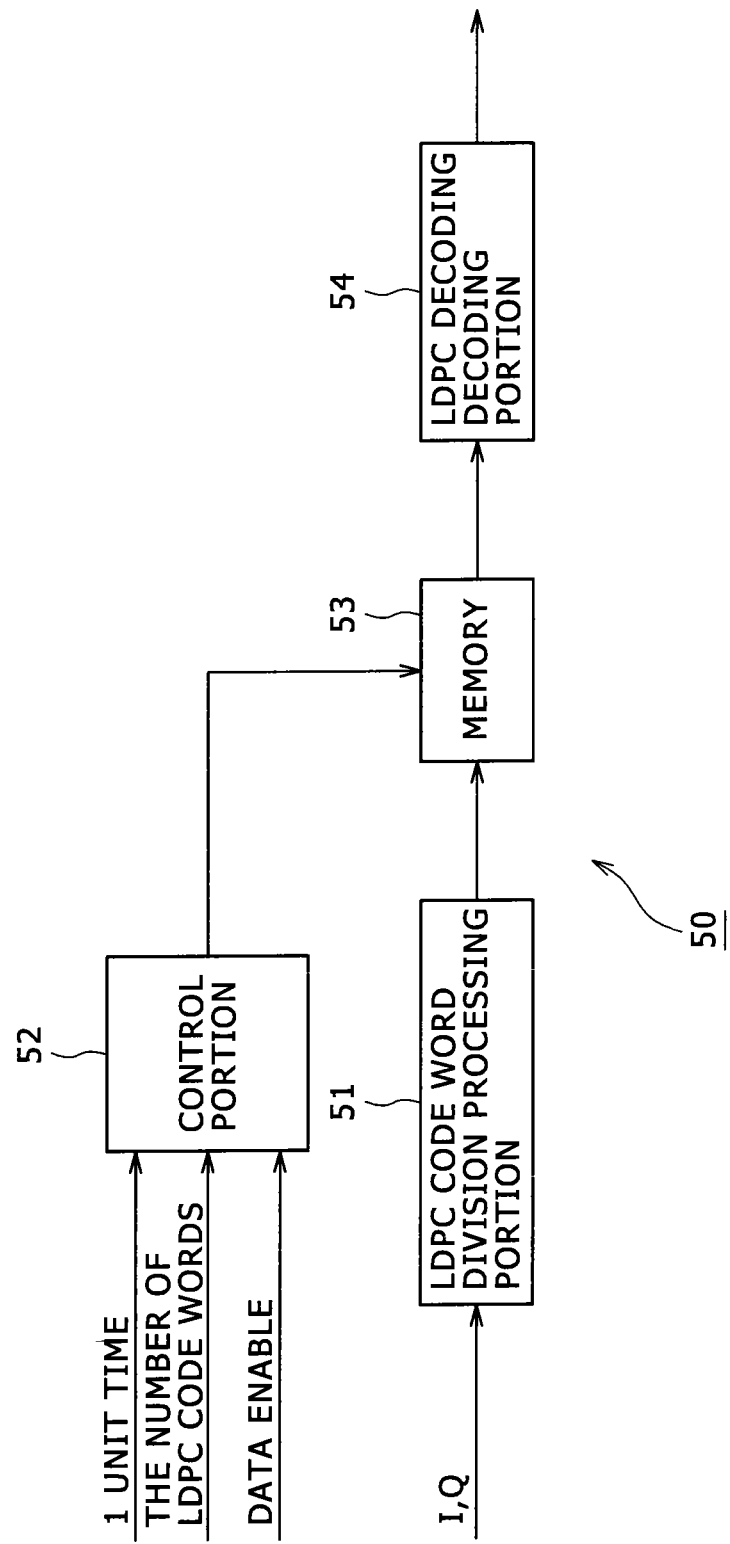
FIG. 2 is a block diagram showing a configuration of a first embodiment of a decoding portion as a decoding device according to the present disclosure.

The data which has been demodulated either in the single-carrier demodulating portion 15 or in the multi-carrier demodulating portion 16 is inputted to a decoding portion shown in FIG. 2. The decoding portion 50 shown in FIG. 2 is one relating to a portion for decoding a code word obtained through LDPC encoding, and corresponds to a first embodiment of a decoding device of the present disclosure. Also, the data obtained after the data either from the single-carrier demodulating portion 15 or from the multi-carrier demodulating portion 16 has been further subjected to necessary processing such as time de-interleave, that is, the data aimed at the LDPC decoding is inputted to the decoding portion 50.

In the following description, either the single-carrier demodulating portion 15 or the multi-carrier demodulating portion 16 will be described as "the demodulating portion." In addition, the data which is inputted to the decoding portion 50 shown in FIG. 2 (an LDPC code word division processing portion 51 which will be described later) is described as "the data." Also, data which is outputted from the LDPC code word division processing portion 51 which will be described later is described as "an LDPC code word."

The decoding portion 50 shown in FIG. 2 is composed of the LDPC code word division processing portion 51, a control portion 52, a memory 53, and an LDPC decoding portion 54. A signal point (I, Q) after having been subjected to mapping is supplied as data to the LDPC code word division processing portion 51 of the decoding portion 50. Predetermined pieces of information such as "one unit time," "the number of LDPC code words," and "data enable" are individually supplied to the control portion 52. The LDPC code words are supplied from the LDPC code word division processing portion 51 to the memory 53. The memory 53 temporarily stores the LDPC code words supplied thereto and outputs the LDPC code words stored in the LDPC decoding portion 54 in accordance with the control made by the control portion 52.

The LDPC decoding portion 54 LDPC-decodes the LDPC code words supplied thereto, and supplies the LDPC code words thus LDPC-decoded to a processing portion in a subsequent stage which, for example, executes processing such as BCH decoding. Here, prior to a description with respect to detailed processing of the LDPC code word division processing portion 51, the control portion 52, the memory 53, and the LDPC decoding portion 54 in the decoding portion 50 shown in FIG. 2, for the purpose of describing that the decoding can be more precisely carried out in the decoding portion 50 shown in FIG. 2 than in the existing decoding portion, decoding processing in a phase of existing decoding will now be described with reference to FIGS. 3A to 3F.

Figure 3:
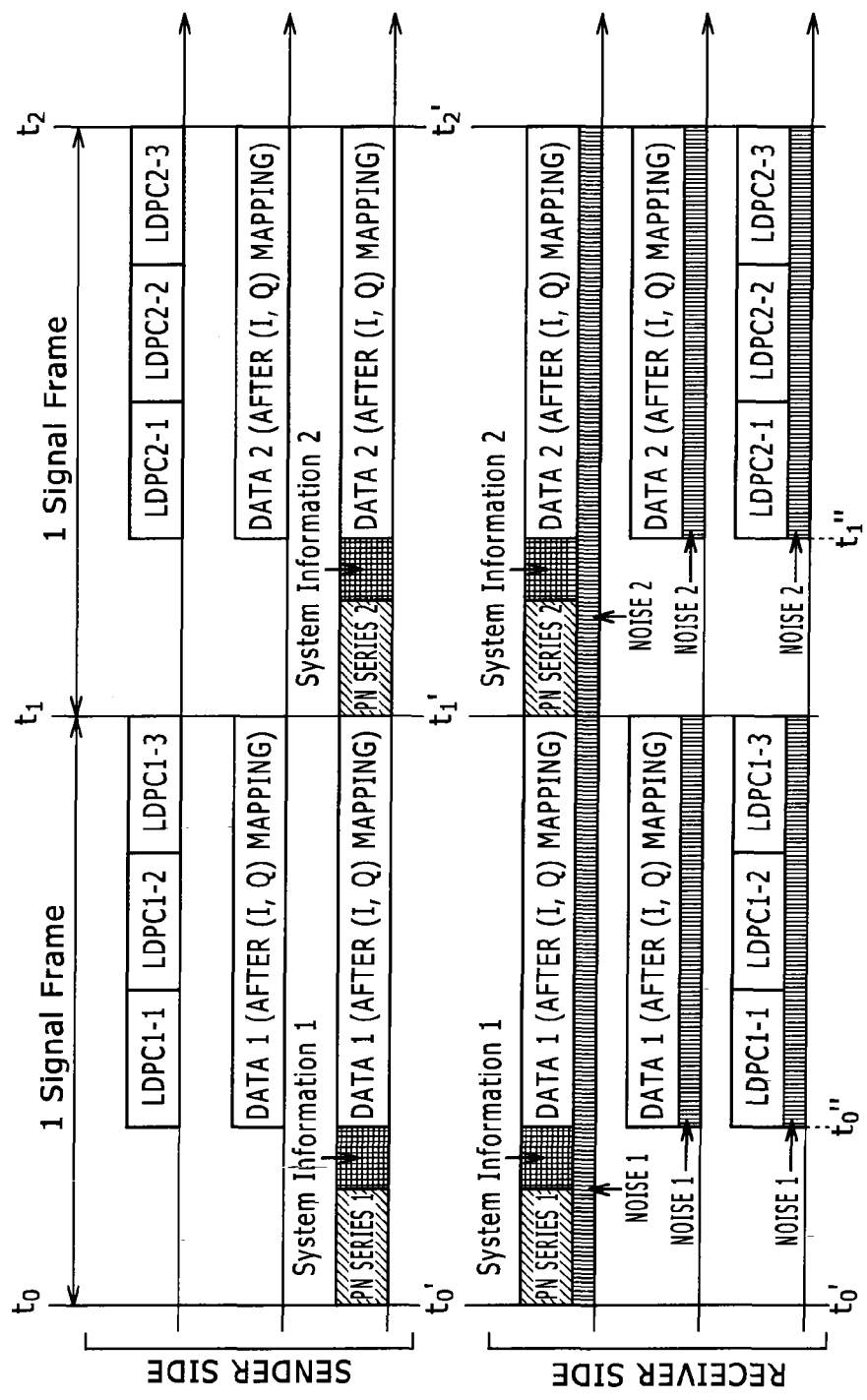
FIGS. 3A to 3F are respectively timing charts explaining time spent on decoding processing.
Figure 4:
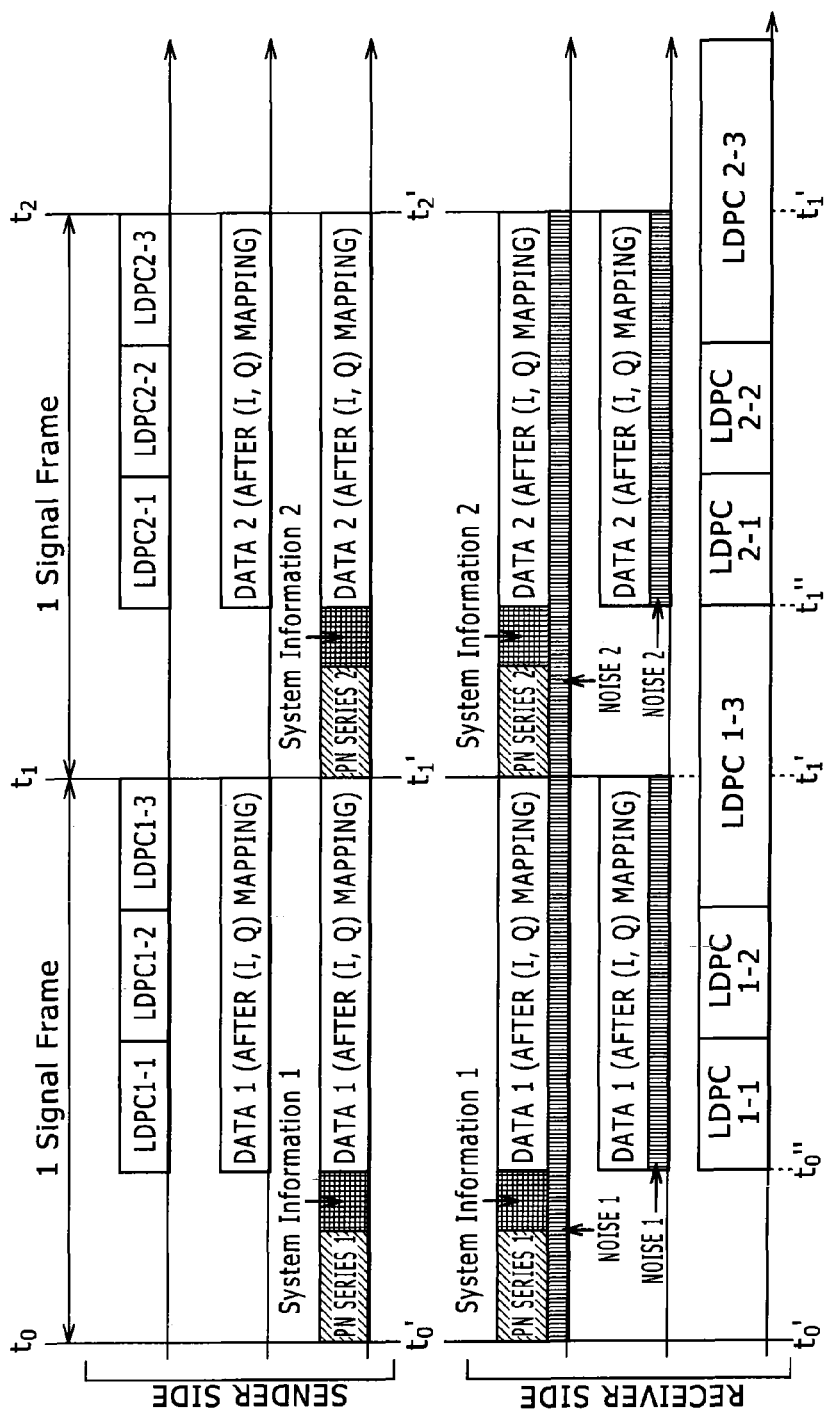
FIGS. 4A to 4F are respectively timing charts explaining time spent on the decoding processing.

FIGS. 3A to 3F are respectively timing charts explaining processing in a sender side, and processing on a receiver side both relating to the LDPC codes and the decoding. FIGS. 3A to 3C are respectively the timing charts explaining the processing on the sender side. Also, FIGS. 3D to 3F are respectively the timing charts explaining the processing on the receiver side. In FIGS. 3A to 3F, a description will now be given by giving an example when one unit is set as 1 signal frame in the DTMB system, and 64QAM is used.

Referring now to FIG. 3A, three code words: LDPC1-1; LDPC1-2; and LDPC1-3 are generated for 1 signal frame from time t0 to tome t1, and are each used as an object of the transmission. The symbols LDPC1-1 to LDPC1-3 represent the code words after having been subjected to the LDPC coding. A bit string obtained by coupling LDPC1-1 to LDPC1-3 to one another is mapped in accordance with constellation information, that is, 64QAM in this case, which results in that as shown in FIG. 3B, data 1 is generated. The data 1 is data obtained after (I, Q) mapping.

Information such as a PN series 1 and System Information 1 is added to such data 1, and the data 1 having the PN series 1 and the System Information 1 added thereto is transmitted to the receiver side. Information such as a coding rate and the constellation information is contained in System Information 1.

Likewise, three code words: LDPC2-1; LDPC2-1; and LDPC2-3 are generated for 1 signal frame from the time t1 to time t2. A bit string obtained by coupling the LDPC2-1 to the LDPC-2-3 to one another is mapped in accordance with the 64QAM, thereby generating data 2. Also, information such as a PN series 2 and System Information 2 is added to the data 2, and the data 2 having the PN series 2 and System Information 2 added thereto is transmitted to the receiver side. Such processing is repetitively executed, which results in that the data is generated and transmitted from the sender side to the receiver side.

The data 1 to which the information such as the PN series 1 and System Information 1 both shown in FIG. 3C has been added, as shown in FIG. 3D, is supplied to the processing portion on the receiver side at time t0'. Various kinds of noises 1 are added to the data 1 depending on a transmission state or the like obtained in the middle of the transmission. It is possible that due to the noises 1, it may be impossible to properly decode the data 1.

The data, such as the PN series 1 and System Information 1, which is unnecessary for the LDPC decoding is removed from the received data, thereby extracting the data 1. Processing such as de-mapping corresponding to the 64QAM is executed for the data 1 thus extracted (refer to a state of FIG. 3E). The information on the constellation and the coding rate is restored from System Information 1 in the demodulating portion, and is then supplied to an error correcting portion (a portion for carrying out the LDPC decoding in this case).

FIG. 3F shows a situation in which the information is transformed into the likelihood in bits and is divided into the three LDPC code word units in the error correcting portion. LDPC1-1, LDPC1-2, and LDPC1-3 shown in FIG. 3F show the state before the LDPC decoding is carried out, and show a state in which the noises 1 are contained. Three pieces of processing for the LDPC decoding are executed so as to correspond to the LDPC1-1, LDPC1-2, and LDPC1-3, respectively.

Such processing is also executed for the data 2 received similarly to the case of the data 1. As shown in FIG. 3F, the LDPC decoding is carried out for LDPC2-1, LDPC2-2, and LDPC2-3. Such processing is repetitively, successively executed for the received data.

On the receiver side, for a period of time from the time t0' to the time t1', the PN series 1, System Information 1, and the data 1 are received and processed in order. As described above, both of the PN series 1 and System Information 1 are unnecessary for the error correcting portion. Therefore, from time at which the data 1 has been acquired on, that is, from time t0" on in FIG. 3F, the LDPC decoding is executed for LDPC1-1. Taking this into consideration, a period of time from the time t0' to the time t0' becomes a period of time for which no correction processing is executed in the error correcting portion. It is noted that to be precise, since it takes time to execute the predetermined pieces of processing such as the demodulation in the portions, although it is not to say that, for example, as shown in FIGS. 3E and 3F, both of the data 1 and LDPC1-1 are obtained at the same timing (at a time point of the time t0"), for the sake of convenience of the description, the illustration is made in such a way and we continue the description.

When such decoding is carried out, the decoding of LDPC1-1 is started at the time point of the time t0". Also, after the decoding of LDPC1-1, LDPC1-2 is decoded. After the decoding of LDPC1-2, LDPC1-3 is decoded. The decoding of LDPC1-3 is ended at the time t1', that is, a time point at which the decoding processing for the data 2 as the next data is started (at a time point at which the supply of the PN series 2 is started).

In the case of such decoding, the decoding portion 50 divides a period of time from the time t" to the time t1 equally among three, and decodes LDPC1-1 to LDPC1-3 by spending the same period of time. In other words, for a period of time from the time t0' to the time t1, LDPC1-1 to LDPC1-3 are decoded with the same number of times of the repetition. LDPC1-1 to LDPC1-3 are decoded with the same number of times of the repetition in such a way, which results in that the precisions of the decoding processing for LDPC1-1 to LDPC1-3 can be equalized.

However, the performance of the decoding processing becomes better as the number of times of the repetition in the phase of the decoding is larger. Preferably, it is better that the number of times of the repetition is large. Here, referring to FIG. 3F again, the decoding of LDPC1-3 is ended at the time t1, and no decoding processing is executed until the decoding of LDPC2-1 is started at the time t1". The decoding processing is made to be executed for the period of time as well for which no decoding is carried out, and the processing is executed so as to increase the numbers of times of the repetition for the respective code words.

FIGS. 4A to 4F are respectively timing charts explaining another decoding processing. Thus, FIGS. 4A to 4F are respectively timing charts explaining the case where the control is carried out in such a way that for the period of time as well from the time t1' to the time t1", the decoding processing is executed. Predetermined pieces of time shown in FIGS. 4A to 4F are the same as those of time shown in FIGS. 3A to 3F, respectively.

Similarly to the case shown in FIG. 3F, the period of time from the time t0" to the time t1' is divided equally among three, and each of LDPC1-1 and LDPC1-2 is decoded by using a period of time corresponding to one interval of the time obtained through the trisection. LDPC1-3 is decoded by using a period of time obtained by adding a period of time from the time t1' to the time t1" to the period of time corresponding to one interval of the time obtained through the trisection.

That is to say, in this case, in the decoding processing described with reference to FIG. 3F, the period of time from the time t1' to the time t1" for which the decoding portion 50 does not carry out the decoding is allocated as a period of time for the deciding of LDPC1-3. Therefore, LDPC1-3 is decoded by spending more time than that of each of LDPC1-1 and LDPC1-2. In other words, the number of times of the repetition in the phase of the decoding of LDPC1-3 is larger than that in the phase of the decoding of each of LDPC1-1 and LDPC1-2. Thus, LDPC1-3 is decoded with the larger number of times of the repetition than that in each of LDPC1-1 and LDPC1-2. Therefore, LDPC1-3 is decoded more precisely than each of LDPC1-1 and LDPC1-2.

Such decoding processing means that there is the dispersion in the number of times of the repetition in the phase of the decoding depending on the code words. When there is the dispersion in the number of times of the repetition in the phase of the decoding depending on the code words, since the performance of the code word corresponding to the small number of times of the repetition becomes dominant, there is possible that the entire decoding performance becomes worse.

From the description given with reference to FIGS. 3A to 3F, and FIGS. 4A to 4F, it is understood that when the number of times of the repetition is set large as much as possible, and the numbers of times of the repetition for the code words are identical to one another, the performance of the decoding processing is improved. Then, the decoding is made to be carried out in the manner as shown in FIGS. 5A to 5G.

Since in FIGS. 5A to 5G, FIGS. 5A to 5F are the same as FIGS. 3A to 3F, respectively, and since a description thereof was previously given, the description thereof is omitted here for the sake of simplicity.

Figure 5:
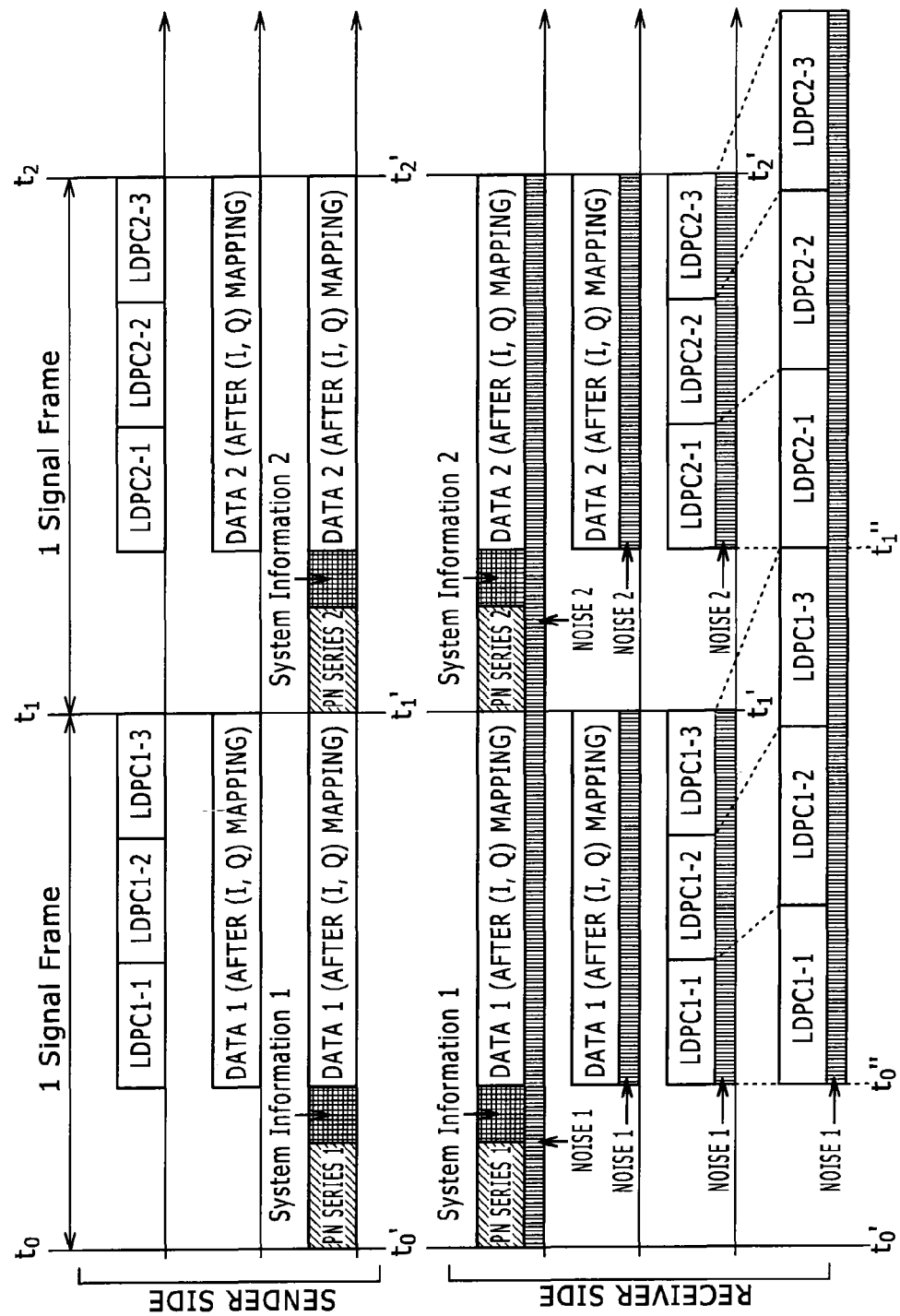
FIGS. 5A to 5G are respectively timing charts explaining time spent on the decoding processing.

As shown in FIG. 5F, the de-mapping processing or the like is executed, which results in that LDPC1-1 to LDPC1-3 as the code words before the LDPC decoding is carried out are obtained. The control is carried out in such a way that LDPC1-1 to LDPC1-3 are LDPC-decoded with the same number of times of the repetition for the period of time from the time t0" to the time t1" (refer to a state shown in FIG. 5G).

The control is carried out in such a way that plural code words (such as LDPC1-1 to LDPC1-3) contained in a predetermined signal frame are decoded by using a period of time from a time point at which the plural code words (such as LDPC1-1 to LDPC1-3) contained in the predetermined signal frame come to be capable of being started to be decoded up to a time point before plural code words (such as LDPC2-1 to LDPC2-3) contained in a next signal frame is started. Plural code words are decoded in such a way, which results in that the plural code words can be decoded with the same number of times of the repetition and in a state in which the same number of times of the repetition can be maximized by using a maximum period of times for which plural code words can be decoded.

Such decoding processing can be executed, which results in that it is possible to prevent that the performance of the code word corresponding to the small number of times of the repetition becomes dominant due to the dispersion in the number of times of the repetition depending on the code words, and thus the entire performance of the decoding becomes worse. In addition, it is possible to improve the precisions of the decoding processing for the individual code words, and it is also possible to enhance the precision of the decoding processing as a whole.

The decoding portion 50 for carrying out such decoding will now be described with reference to FIG. 2 again. The data which has been demodulated in the demodulating portion is inputted to the LDPC code word division processing portion 51 of the decoding portion 50. The LDPC code word division processing portion 51 divides the data inputted thereto in units of one LDPC code word, and outputs the resulting data to the memory 53. For example, the data 1 shown in FIG. 5E is inputted to the LDPC code word division processing portion 51. The LDPC code word division processing portion 51 executes processing for converting the data 1 thus inputted thereto into LDPC1-1 to LDPC1-3 shown in FIG. 5F, and outputting the resulting LDPC1-1 to LDPC1-3 to the memory 53. That is to say, since the three LDPC code words, LDPC1-1, LDPC1-2, and LDPC1-3 are contained in the data 1, processing for cutting out the three LDPC code words into LDPC code words one by one (processing for extracting the three LDPC code words one by one) is executed in the LDPC code word division processing portion 51.

The LDPC code word outputted from the LDPC code word division processing portion 51 is outputted to the memory 53 to be stored therein. The memory 53 carries out an operation for writing the LDPC code word supplied thereto from the LDPC code word division processing portion 51, and an operation for reading the LDPC code word to the LDPC decoding portion 54 in accordance with an instruction issued from the control portion 52.

The three pieces of information, such as "one unit time," "the number of LDPC code words," and "data enable" are supplied from the demodulating portion to the control portion 52. The information on "one unit time" is a period of time for 1 signal frame, for example, in the case of the DTMB system. In FIGS. 5D to 5G, "one unit time," for example, means a period of time from the time t0' to the time t1', and the information on this period of time is supplied as the information on "one unit time" from the demodulating portion to the control portion 52.

The information on "the number of LDPC code words" means the number of LDPC code words contained in one unit time. In FIGS. 5D to 5G, "the number of LDPC code words," for example, are 3 because the three code words, LDPC1-1, LDPC1-2, and LDPC103 are contained in one unit time. Thus, the information on "3" is supplied as the information on "the number of LDPC code words" from the demodulating portion to the control portion 52.

The information on "data enable" means a signal (set at "H" in this case) representing that when the data can be utilized, the data is enable. When this signal is set at "H," an instruction is issued in such a way that the LDPC code word supplied from the LDPC code word division processing portion 51 is written to the memory 53.

The control portion 52 generates and supplies a control signal in accordance with which the code word written to the memory 53 is supplied to the LDPC decoding portion 54 at a predetermined timing to the memory 53. The control signal is obtained as follows. Firstly, time A obtained by dividing one unit time T the information on which is inputted by the number N_L of LDPC code words within one unit time is expressed by Expression (1):

$$\text{time } A = T/N\_L \quad (1)$$

It is understood from Expression (1) since the time A is a value obtained by dividing the one unit time by the number of LDPC code words contained in the one unit time, the time A is time which is allocated to one LDPC code word when the one unit time is equally divided by the number of LDPC code words. That is to say, the time A is one which can be allocated to the processing for the decoding for the one LDPC code word.

Here, referring to FIGS. 5A to 5G again, in FIG. 5F, for example, a period of time (assigned as a period M of time) from the time t0' to the time t0" is one for which both of the PN series 1 and System Information 1 are processed. However, this period of time is equal to a period of time for which both of the PN series 2 and System Information 2 are processed within a period of time (assigned as a period N of time) from the time t1' to the time t1" as expressed by Expression (2):

$$\text{the period } M \text{ of time} = \text{the period } N \text{ of time} \quad (2)$$

In FIG. 5G, a period of time for which LDPC1-1 to LDPC1-3 are all processed is a period of time (assigned as a period X of time) from the time t0" to the time t1". This period X of time for the processing is composed of a period of time (assigned as a period Y of time) from the time t0" to the time t1', and a period of time (assigned as a period N of time) from the time t1' to the time t1" as expressed by Expression (3):

$$\text{the period } X \text{ of time for the processing} = \text{the period } Y \text{ of time} + \text{the period } N \text{ of time} \quad (3)$$

Since the period N of time, as described above, is equal to the period of time from the time t0' to the time t0", the period N of time becomes the period M of time. Therefore, the period X of time for the processing becomes a period of time obtained by adding the period Y of time and the period M of time to each other as expressed by Expression (4):

$$\text{the period } X \text{ of time for the processing} = \text{the period } Y \text{ of time} + \text{the period } M \text{ of time} \quad (4)$$

Therefore, the period X of time becomes consequently equal to a period of time for the time of 1 signal frame. Therefore, when the period X of time for the processing (one unit time (the period of time for 1 signal frame)) is divided by the number of LDPC code words contained therein, the resulting period of time becomes the period of time for the processing spent on the decoding of the one LDPC code word. Therefore, a period of time for the decoding spent on the decoding processing for the one LDPC code word, as described above, is obtained by calculating Expression (1) by using the one unit time T, and the number N_L of LDPC code words within the one unit time.

After the control portion 52 has calculated the period of time spent on the decoding processing for the one LDPC code word in such a way, the control portion 52 generates a control signal in accordance with which the one LDPC code word is supplied from the memory 53 to the LDPC decoding portion 54 in such a way that the LDPC decoding portion 54 can execute the decoding processing for the period of time for the decoding processing.

The control signal is a signal for controlling in such a way that the one LDPC code word is supplied from the memory 53 to the LDPC decoding portion 54 for the period A of time, and thus is outputted to the memory 53. When the number of data contained in the one LDPC code word is, n, for example, the control signal to read out the one LDPC code word from the memory 53 is set as such a control signal that one reading operation is carried out every A/n. In this case, the control signal is supplied to the memory 53 in such a way that the n pieces of data are successively outputted for the period A of time every data. Or, the control signal may also be supplied to the memory 53 in such a way that the n pieces of data are read out in a burst style. In this case, preferably, the control is carried out in such a way that this operation is prevented from overlapping the operation for writing the data composing the one LDPC code word.

The memory 53 writes the LDPC code word supplied thereto from the LDPC code word division processing portion 51 or reads the one LDPC code word to the LDPC decoding portion 54 in accordance with the control signal generated and supplied thereto from the control portion 52. The LDPC code word which is read out from the memory 53 and is then supplied to the LDPC decoding portion 54 is such data as to be shown in FIG. 5G. That is to say, referring to FIG. 5G, for the period of time from the time t0" to the time t1", LDPC1-1, LDPC1-2, and LDPC1-3 are successively outputted in this order at the timing allowing the decoding in the LDPC decoding portion 54 by spending the same period of time.

The LDPC decoding portion 54 carries out the repetitive decoding until the data on the next LDPC code word is inputted thereto by using the data on the one LDPC code word supplied thereto from the memory 53. That is to say, for example, while the decoding of LDPC1-1 is carried out as shown in FIG. 5G, the repetitive decoding is carried out for LDPC1-1 until LDPC1-2 is inputted to the LDPC decoding portion 54. When LDPC1-2 has been inputted to the LDPC decoding portion 54, the decoding of LDPC1-1 is ended, and the decoding processing for LDPC1-1 is switched over to LDPC1-2. Such decoding processing is repetitively executed.

The decoding is carried out in the LDPC decoding portion 54, which results in that the periods of time allocated to the code words, respectively, become uniform, and thus the numbers of times of the repetitive decoding in the respective code words are equalized. Therefore, the dispersion in the numbers of times of the repetition of in the phase of the decoding is removed, and the numbers of times of the repetition in the respective code words can be increased. Therefore, it is possible to improve the precisions of the decoding of the individual code words, and it is also possible to enhance the precision of the decoding as a whole.

An operation of the decoding portion 50 will be described below with reference to a flow chart shown in FIG. 6. In Step S11, the decoding portion 50 acquires both of the data and the information. The LDPC code word division processing portion 51 acquires the data as an object of the decoding from the decoding portion. Also, the control portion 52 acquires the information on "the one unit time," "the number of LDPC code words," and "the data enable" from the decoding portion.

In Step S12, the LDPC code word division processing portion 51 divides the data thus acquired into one LDPC code words. In Step S13, the control portion 52 generates the control signal from the information thus acquired. The control signal thus generated, as described above, is a signal in accordance with which the LDPC code word is instructed to be written or read out to or from the memory 53.

In Step S14, the memory 53 supplies the LDPC code word to the LDPC decoding portion 54 in accordance with the control signal supplied thereto from the control portion 52. Also, in Step S15, the LDPC decoding portion 54 carries out the repetitive decoding for the LDPC code word supplied thereto. While the LDPC decoding portion 54 carries out the decoding, in Step S16, the control portion 52 judges whether or not a timing at which a next LDPC code word is to be outputted has come. Until the control portion 52 judges in Step S16 that the timing at which the next LDPC code word is to be outputted has come, the decoding in the LDPC decoding portion 54 in Step S15 is continuously carried out.

When the control portion 52 judges in Step S16 that the timing at which the next LDPC code word is to be outputted has come, the operation is returned back to the processing in Step S13. The operation is returned back to the processing in Step S13, which results in that the control portion 52 generates a control signal to instruct the LDPC decoding portion 54 to output the one LDPC code word, and outputs the control signal thus generated to the memory 53. As a result, the operation proceeds to processing in Step S14, and the one LDPC code word is supplied from the memory 53 to the LDPC decoding portion 54. When the new one LDPC code word has been supplied to the LDPC decoding portion 54, the LDPC decoding portion 54 completes the decoding of the one LDPC code word having been decoded at this time point, and switches the current decoding processing over to the processing for decoding the one LDPC code word which has been newly supplied thereto.

Such processing is executed in the decoding portion 50, which results in that the decoding is carried out precisely.

Second Embodiment

Next, a second embodiment of a decoding portion 100 as a decoding device will be described in detail. In the first embodiment of the decoding portion 50, the decoding portion 50 is configured as shown in FIG. 2, and the processing shown in the flow chart of FIG. 6 is executed, thereby carrying out the decoding for the LDPC code word. In the first embodiment, the period of time spent on the decoding processing for the one LDPC code word is calculated as the period A of time, and the same period of time is allocated to each of plural LDPC code words contained in the one unit period of time. Under this condition, the decoding for the LDPC code word is carried out.

With regard to the LDPC decoding, a judgment of end of the decoding is carried out, and thus the decoding is ended in some cases. Therefore, like the first embodiment, when plural code words are coded with the same number of times of the repetition, the undue repetitive coding is carried out depending on the code words, thereby carrying out the decoding for the LDPC code word in some cases. In addition, it is also expected that the number of times of the repetition is small depending on the code words, and thus the decoding processing is ended before the decoding processing is judged to be ended in the end judgment. Then, in the second embodiment, periods of times spent on the decoding processing for the code words are not fixed, but are made variable.

Figure 7:
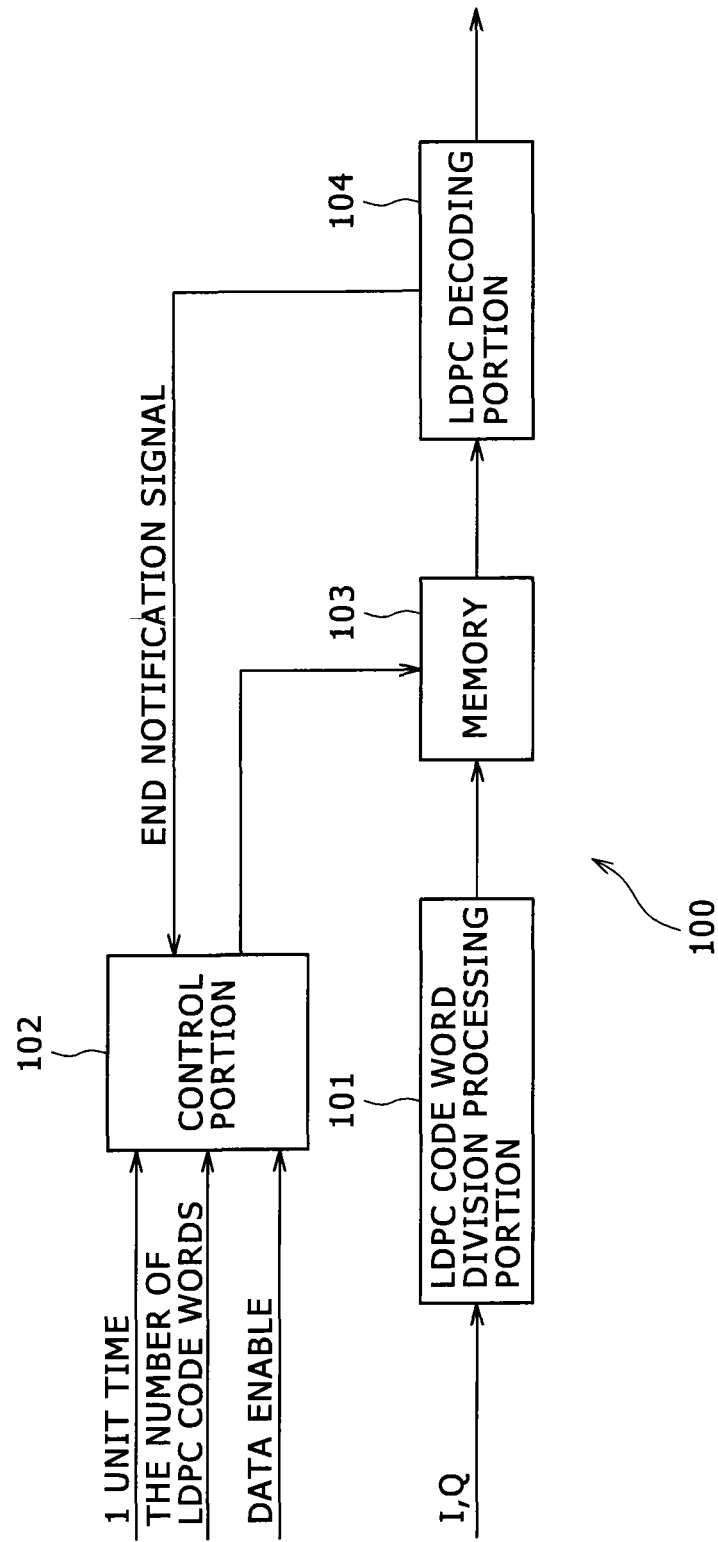
FIG. 7 is a block diagram showing a configuration of a second embodiment of a decoding portion as the decoding device according to the present disclosure.

FIG. 7 is a block diagram showing a configuration of the second embodiment of the decoding portion. The decoding portion 100 shown in FIG. 7 is composed of an LDPC code word division processing portion 101, a control portion 102, a memory 103, and an LDPC decoding portion 104. Although the decoding portion 100 shown in FIG. 7 has basically the same configuration as that of the decoding portion 50 shown in FIG. 2, the decoding portion 100 shown in FIG. 7 is different in configuration from the decoding portion 50 shown in FIG. 2 in that the LDPC decoding portion 104 outputs an end notification signal to the control portion 102 in a phase of end of the decoding processing. Since other points of the decoding portion 100 shown in FIG. 7 are identical in configuration to those of the decoding portion 50 shown in FIG. 2, a description thereof is omitted here for the sake of simplicity.

The LDPC decoding portion 104 judges whether or not the decoding processing for the LDPC code word being decoded has been ended. When the LDPC decoding portion 104 judges that the decoding processing for the LDPC code word being decoded has been ended, the LDPC decoding portion 104 outputs the end notification signal representing the end of the decoding processing to the control portion 102. The decoding processing is executed in the decoding portion 100 configured in such a way in accordance with a flow chart shown in FIG. 8.

Figure 6:
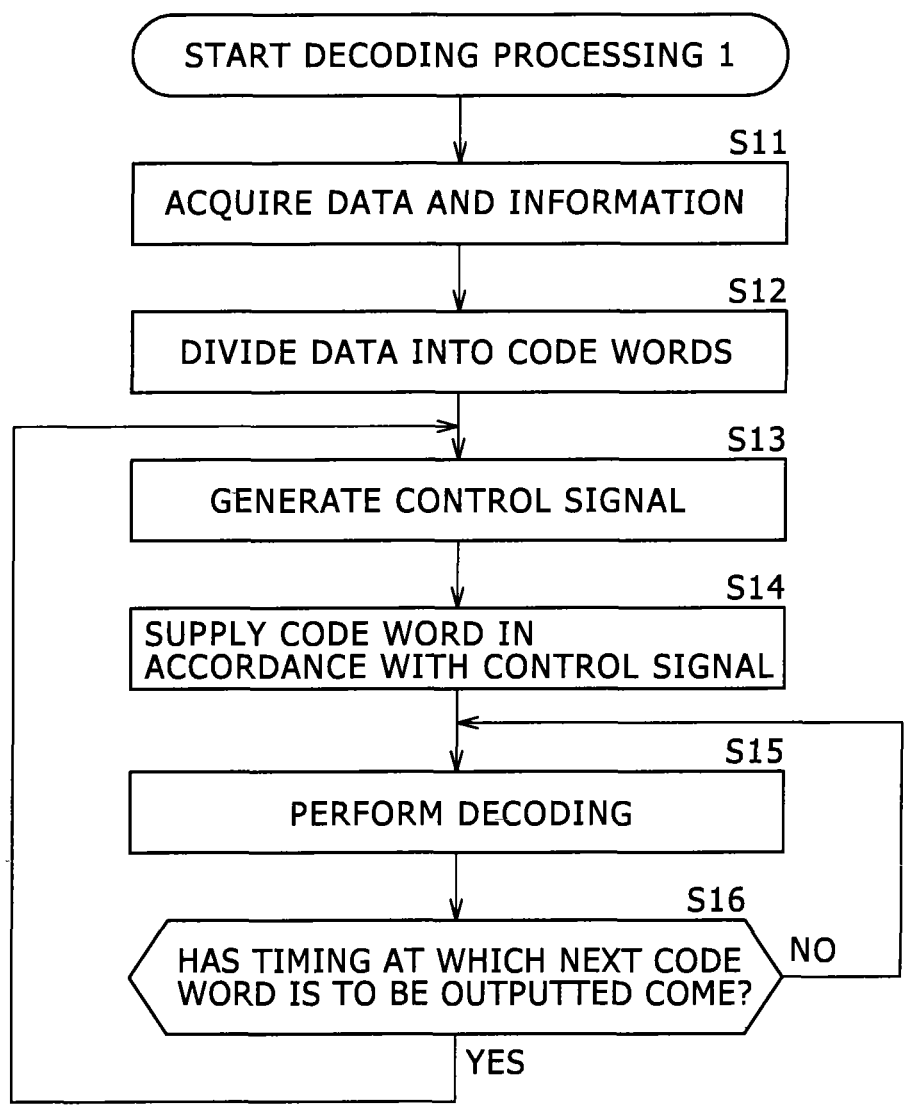
FIG. 6 is a flow chart explaining processing in a decoding portion shown in FIG. 2.

Since the six pieces of processing in Steps S31 to S35, and S37 are basically identical to those in Steps S11 to S16 of FIG. 6, a detailed description thereof is omitted here for the sake of simplicity.

In Step S36, the control portion 102 judges whether or not the end notification signal has been received from the LDPC decoding portion 104. When the LDPC decoding portion 104 can judge that the decoding processing for the LDPC code word being decoded has been ended, the LDPC decoding portion 104 outputs the end notification signal to the control portion 102. The LDPC decoding portion 104 executes the repetitive decoding processing, and carries out the end judgment every repetition of the decoding processing. Also, when the LDPC decoding portion 104 judges that the decoding processing for the LDPC code word being decoded has been ended, the LDPC decoding portion 104 outputs the end notification signal to the control portion 102.

When the control portion 102 judges that the end notification signal has been received from the LDPC decoding portion 104, the operation is returned back to the processing in Step S33. In Step S33, the control portion 102 generates the control signal. The control signal generated after reception of the end notification signal by the control portion 102 is different from the control signal generated when the information has been acquired from the demodulating portion.

The control signal generated after reception of the end notification signal by the control portion 102 is generated based on the number of LDPC code words each of which is not yet decoded, and the remaining period of time. For example, a period of time spent on the decoding processing for the LDPC code word for which the decoding has been completed (a period of time from the output of the control signal to the memory 103 to the reception of the end notification signal) is subtracted from the one unit time. Also, the remaining period of time is divided by the number of LDPC code words each of which is not yet decoded, thereby recalculating the period of time for the decoding spent on the decoding processing for the one LDPC code word.

Figure 9:
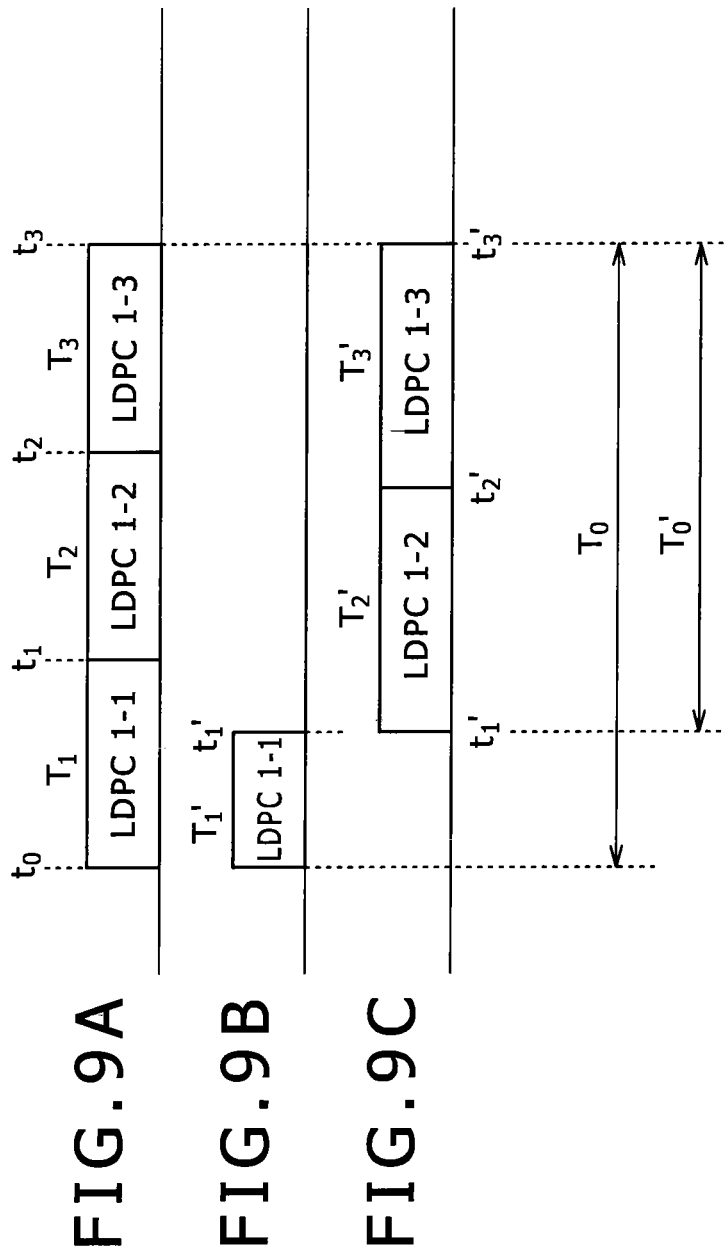
FIGS. 9A to 9C are respectively time charts explaining time spent on decoding processing.

A description will now be given with reference to FIGS. 9A to 9C. Referring now to FIG. 9A, when the control portion 102 recognizes that one unit time is a period T0 of time from the time t0 to the time t3, and the number of LDPC code words is three from the information acquired from the demodulating portion, the period T0 of time is divided by three, thereby calculating a relationship of the period A of time=the period T1 of time=the period T2 of time=the period T3 of time. The period T1 of time is a period of time from the time t0 to the time t1, the period T2 of time is a period of time from the time t1 to the time t2, and the period T3 of time is a period of time from the time t2 to the time t3.

Let us consider the case where the LDPC decoding portion 104 judges that LDPC1-1 is decoded from the time t0 and the decoding processing for LDPC1-1 is encoded at the time t1', and the LDPC decoding portion 104 outputs the end notification signal to the control portion 102. The time t1' is time earlier than the time t1. In other words, a period T1' of time spent on the actual decoding processing is shorter than the period T1 of time allocated to the decoding processing for LDPC1-1. In such a case, the period T1' of time spent on the decoding processing for LDPC1-1 is subtracted from the period T0 of time (one unit time), thereby calculating the remaining period T0' of time (a period of time from the time t1' to the time t3). Also, since the LDPC code words each of which is not yet decoded are the two code words, such as LDPC1-2 and LDPC1-2, the period T0' of time is divided by two, thereby calculating a period T2' of time, and a period T3' of time.

The period T2' of time, and the period T3' of time show a relationship of the period T2' of time=the period T3' of time. The period T2' of time is a period of time spent on the decoding processing newly allocated to LDPC1-2. Also, the period T3' of time is a period of time spent on the decoding processing newly allocated to LDPC1-3. Since the period T2' of time is longer than the period T2 of time spent on the decoding processing originally allocated to LDPC1-2, the number of times of the repetition of LDPC1-2 can be made larger than that in the case of the period T2 of time. Likewise, since the period T3' of time is longer than the period T3 of time spent on the decoding processing originally allocated to LDPC1-3, the number of times of the repetition of LDPC1-3 can be made larger than that in the case of the period T3 of time.

Therefore, it is possible to enhance the precision of the decoding processing for each of LDPC1-2 and LDPC1-3. In addition, since the decoding for LDPC1-1 has been judged to be ended, even when LDPC1-1 has been decoded with the smaller number of times of the repetition than each of the numbers of times of the repetition of LDPC1-2 and LDPC1-3, it is not to say that the precision of the decoding processing for LDPC1-1 is low, but to say that the precision equal to or higher than that of the decoding processing for LDPC1-2 and LDPC1-3 is maintained.

The number of times of the repetition is made variable in such a way, which results in that the number of times of the repetition is dispersed. However, since it is not to say that since the LDPC code word which is decoded with the small number of times of the repetition is low in precision (fulfills the necessary precision), the precision of the decoding processing is prevented from being lowered due to the dispersion in the number of times of the repetition.

Figure 8:
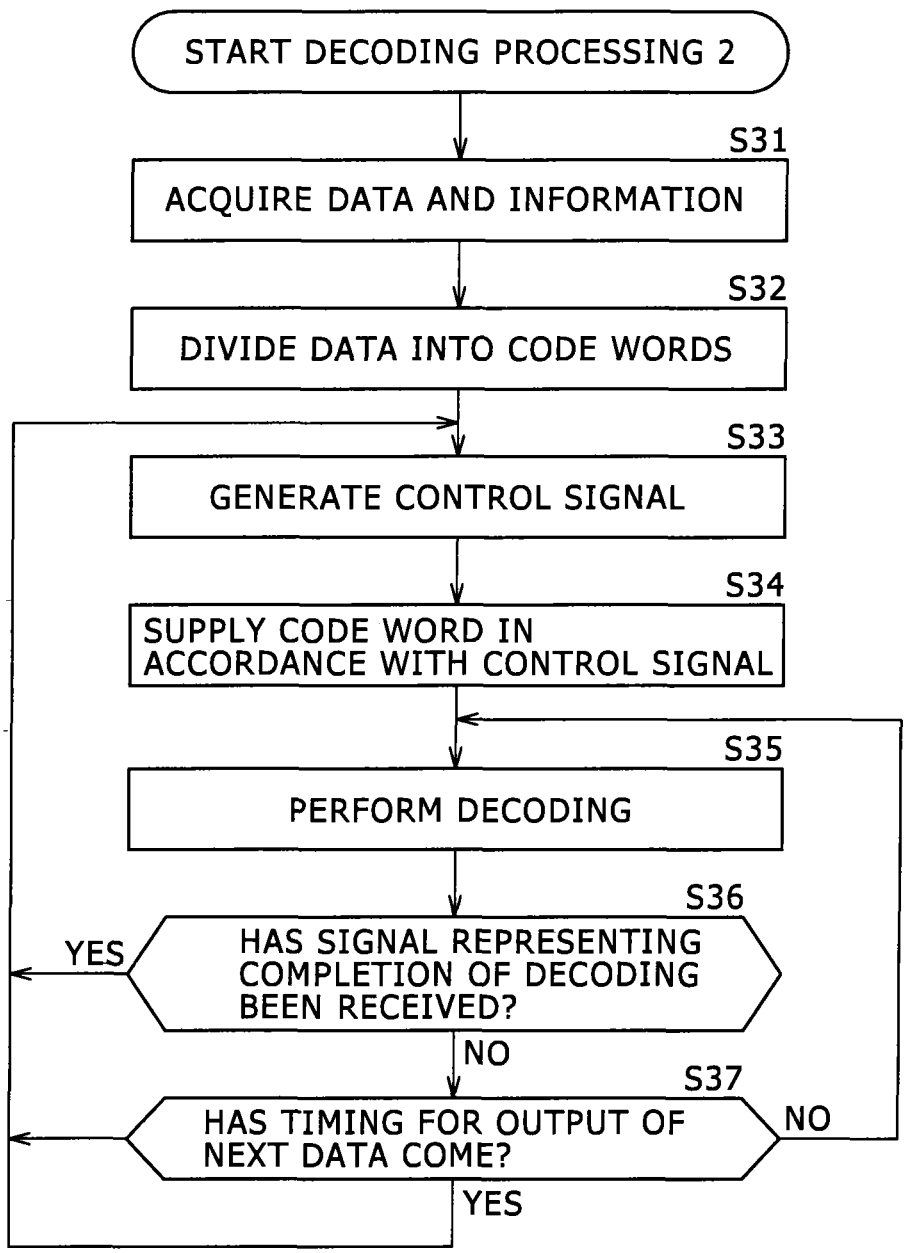
FIG. 8 is a flow chart explaining processing in a decoding portion shown in FIG. 7.

Referring back to the description of the flow chart shown in FIG. 8, the control portion 102 which has received the signal representing the completion of the decoding processing in Step S36 (YES) generates the control signal in Step S33. The control signal is generated in the manner as described above. The four pieces of processing in and after the processing in Step S34 are executed in accordance with the control signal thus generated. That is to say, in accordance with the new control signal, the memory 103 outputs the LDPC code word to the LDPC decoding portion 104, and the LDPC decoding portion 104 executes the decoding processing.

On the other hand, when the control portion 102 judges in Step S36 that the control portion 102 does not yet receive the signal representing the completion of the decoding processing (NO), the operation proceeds to processing in Step S37. In Step S37, the control portion 102 judges whether or not a timing at which the next data to be outputted has come. When the control portion 102 judges in Step S37 that the timing at which the next data to be outputted does not yet have come (NO), the operation is returned back to the processing in Step S35. That is to say, in this case, the control portion 102 instructs the LDPC decoding portion 104 to continue the decoding processing, and the LDPC decoding portion 104 continues the decoding processing.

On the other hand, in Step S37, the control portion 102 judges that the timing at which the next data to be outputted has come (YES), the operation is returned back to the processing in Step S33, and the five pieces of processing in and after the processing in Step S33 are repetitively executed.

The numbers of times of the repetition are firstly fixed in such a way, and the setting is made in such a way that there is no dispersion in the numbers of times of the repetition, and under this condition, the decoding processing is executed. After that, when the decoding processing is early ended, the numbers of times of the repetition are changed in such a way that the more numbers of times of the repetition are allocated to the remaining code words, and under this condition, the decoding processing is executed.

Therefore, it is possible to increase the numbers of times of the repetition in the phase of the decoding processing, and thus it is possible to enhance the precision of the decoding processing.

Third Embodiment

In the first and second embodiments of the decoding portions (decoding device), the description has been given by exemplifying the decoding portion 50 (the decoding portion 100) including the memory 53 (the memory 103). When a memory which is used during the processing for a time interleaver (convolution interleaver) is provided in a preceding stage of the LDPC decoding 54 (the LDPC decoding 104), this memory can be used instead of using the memory 53 (the memory 103). The memory which is used during the processing for the time interleaver (convolution interleaver) is used in such a way, which results in that since it is unnecessary to adopt a configuration such that the memory is newly added when the decoding processing described above is executed, it is possible to prevent the number of memories from being increased in order to execute the decoding processing described above.

Although in the first to third embodiments described above, the description has been given by exemplifying the LDPC code (LDPC decoding), as long as the system is the coding system (decoding system) for carrying out the repetitive decoding, the present disclosure can be applied to such a system.

In addition, although in the first and second embodiments, the configuration such that the memory 53 (the memory 103) is provided has been described as an example, there may also be adopted a configuration such that a delay portion is provided instead of providing the memory 53 (the memory 103).

According to the present disclosure, the memory (delay portion) is provided in the preceding stage for execution of the LDPC decoding, and the output of the data from the memory (delay portion) is adjusted in such a way that the numbers of times of the repetition during the decoding of the code words become constant. Therefore, the decoding can be carried out in the state in which there is no dispersion in the numbers of times of the repetition during the LDPC decoding, and thus it is possible to enhance the precision of the decoding processing. In addition, after the numbers of times of the repetition are fixed, the numbers of times of the repetition thus fixed can be made variable. Even when the numbers of times of the repetition thus fixed are made variable, it is possible to prevent the deterioration of the precision of the decoding processing due to the dispersion in the numbers of times of the repetition, and it is possible to carry out the decoding in the state in which the precision is enhanced.

[Use Application]

The series of processing described above either can be executed by hardware or can be executed by software. When the series of processing described above are executed by the software, a program composing the software is installed in the personal computer. Here, a computer incorporated in dedicated hardware, a computer which can carry out various kinds of functions by installing therein various kinds of programs, for example, a general-purpose personal computer, and the like are included in the computer concerned.

Figure 10:
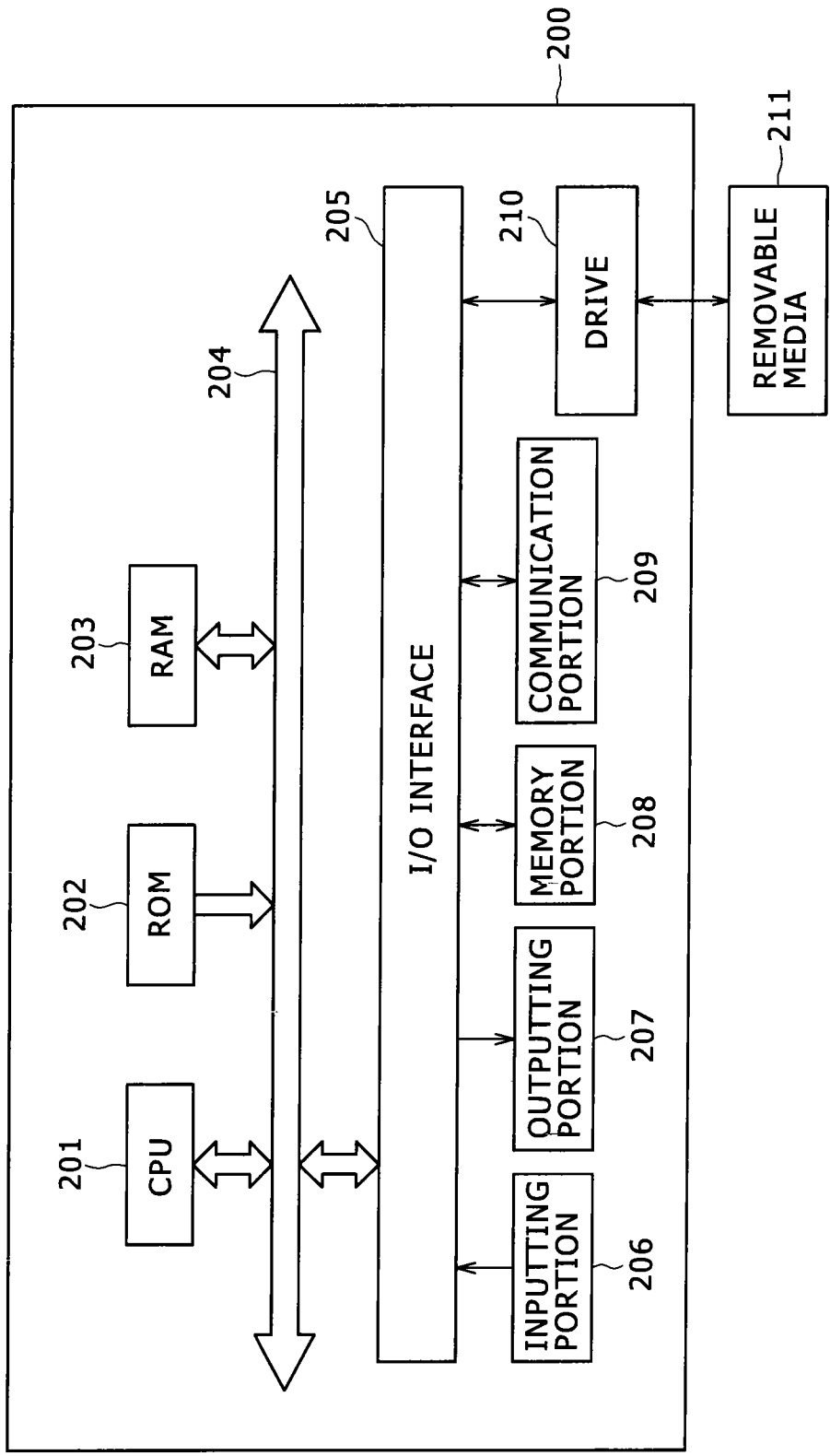
FIG. 10 is a block diagram showing a configuration of a recording media.

FIG. 10 is a block diagram showing an example of a configuration of the hardware of the computer for executing the series of processing described above in accordance with a program. In the computer, a Central Processing Unit (CPU) 201, a Read Only Memory (ROM) 202, and a Random Access Memory (RAM) 203 are connected to one another through a bus 204. An I/O (input/output) interface 205 is also connected to the bus 204. An inputting portion 206, an outputting portion 207, a memory portion 208, a communication portion 209, and a drive 210 are connected to the I/O interface 205.

In this case, the inputting portion 206 is composed of a keyboard, a mouse, a microphone or the like. The outputting portion 207 is composed of a display device, a speaker or the like. The memory portion 208 is composed of a hard disc or a non-volatile memory or the like. The communication portion 209 is composed of a network interface or the like. The drive 210 drives a removable media 211 such as a magnetic disc, an optical disc, a magneto optical disc, or a semiconductor memory.

With the computer configured in the manner as described above, for example, the CPU 201 loads the program stored in the memory portion 208 into the RAM 203 through the I/O interface 205 and the bus 204 in order to execute the program, thereby executing the series of processing described above.

The program which the computer (the CPU 201) executes, for example, can be recorded in the removable media 211 as a package media or the like to be provided. In addition, the program can be provided through a wired or wireless transmission media such as a local area network (LAN), the Internet, or the digital satellite broadcasting.

In the computer, the program can be installed in the memory portion 208 through the I/O interface 205 by mounting the removable media 211 to the drive 210. In addition, the program can be received at the communication portion 209 through the wired or wireless transmission media to be installed in the memory portion 208. In addition thereto, the program can be previously installed either in the ROM 202 or in the memory portion 208.

It is noted that the program which the computer executes either may be a program in accordance with which predetermined pieces of processing are executed in a time series manner along the order described in this specification, or may be a program in accordance with which the predetermined pieces of processing are executed in parallel or at a necessary timing such as when a call is made.

In addition, in this specification, the system means the entire apparatus composed of plural devices.

It is noted that the embodiments of the present disclosure are by no means limited to the embodiments described above, and various kinds of change can be made without departing from the subject matter of the present disclosure.

It should be understood by those skilled in the art that various modifications, combinations, sub-combinations and alterations may occur depending on design requirements and other factors insofar as they are within the scope of the appended claims or the equivalents thereof.

The present disclosure contains subject matter related to that disclosed in Japanese Priority Patent Application JP 2010-240242 filed in the Japan Patent Office on Oct. 27, 2010, the entire content of which is hereby incorporated by reference.

What is claimed is:

1. A decoding device, comprising:
circuitry configured to acquire data containing plural code words and information other than the plural code words in one frame, and extract the plural code words from the data;
the plural code words extracted;
set a time obtained for decoding each of the plural code words by dividing a time for one full frame by a number of code words contained in the one frame, the time being allocated to decoding of one code word; and
a decoding section decoding each of the plural code words within the time allocated, decoding of the code words overlapping reception of a subsequent frame by a time equal to an idle time in which code words of the subsequent frame are not decoded.

2. The decoding device according to claim 1, wherein said circuitry carries out repetitive decoding.

3. The decoding device according to claim 1, wherein said circuitry carries out low density parity check decoding.

4. The decoding device according to claim 1, wherein the one code word is read out every allocated time.

5. The decoding device according to claim 1, wherein when the decoding of the code word is ended at a time point before the time allocated, and a time obtained by subtracting time spent on the decoding from the time for the one frame is divided by the number of code words each of which is not yet decoded, a resulting time is set as time allocated to the decoding of the code words each of which is not yet decoded.

6. The decoding device according to claim 1, wherein said circuitry includes a memory which is used during processing of a time interleaver.

7. A decoding method for use in a decoding device including an extracting section, a storing section, an allocating section, and a decoding section, said decoding method comprising:
acquiring data containing plural code words and information other than the plural code words in one frame, and extracting the plural code words from the data every;
at least storing the plural code words extracted;

setting a time for decoding each of the plural code words obtained by dividing a time for one full frame by the number of code words contained in the one frame as time allocated to decoding of one code word; and decoding each of the plural code words within the time allocated, decoding of the code words overlapping reception of a subsequent frame by a time equal to an idle time in which code words of the subsequent frame are not decoded.

8. A non-transitory computer-readable medium encoded with computer readable instructions thereon, the computer readable instructions when executed by a computer causes the computer to control a decoding device including an extracting section, a storing section, an allocating section, and a decoding section according to a method comprising:

acquiring data containing plural code words and information other than the plural code words in one frame, and extracting the plural code words from the data every;

at least storing the plural code words;

setting a time for decoding each of the plural code words obtained by dividing a time for one full frame by the number of code words contained in the one frame as time allocated to decoding of one code word; and decoding each of the plural code words within the time allocated, decoding of the code words overlapping reception of a subsequent frame by a time equal to an idle time in which code words of the subsequent frame are not decoded.

* * * * *